United States Patent [19]

Rector

[11] Patent Number: 5,061,988
[45] Date of Patent: Oct. 29, 1991

[54] INTEGRATED CIRCUIT CHIP INTERCONNECT

[75] Inventor: Steve Rector, Riverside, Calif.

[73] Assignee: McDonnell Douglas Corporation, Long Beach, Calif.

[21] Appl. No.: 559,668

[22] Filed: Jul. 30, 1990

[51] Int. Cl.⁵ .................... H01L 23/02; H01L 23/12
[52] U.S. Cl. ........................................ 357/74; 357/68; 357/70; 357/80; 361/404; 361/406
[58] Field of Search .................. 357/80, 74, 70, 68; 361/397, 404, 406

[56] References Cited

U.S. PATENT DOCUMENTS

| | | | |
|---|---|---|---|
| 4,234,666 | 11/1980 | Gursky | 428/573 |
| 4,390,598 | 6/1983 | Phy | 428/577 |
| 4,459,607 | 7/1984 | Reid | 357/71 |
| 4,571,354 | 2/1986 | Maxwell | 428/78 |
| 4,684,884 | 8/1987 | Soderlund | 324/73 R |
| 4,701,781 | 10/1987 | Sankhagowit | 357/79 |
| 4,706,811 | 11/1987 | Jung et al. | 206/331 |
| 4,951,120 | 8/1990 | Hagiwara et al. | 357/70 |

*Primary Examiner*—Rolf Hille
*Assistant Examiner*—David Ostrowski
*Attorney, Agent, or Firm*—Donald E. Stout; Gregory A. Cone; John P. Scholl

[57] ABSTRACT

An integrated circuit chip interconnect combining tape automated bonding techniques and conventional wire bonding and adapted to communicate by wire bonding leads to the maximum number of terminal leads for a given chip size, and to accommodate a variety of different chips by the same configuration, the interconnect allowing individual testing of each chip prior to the interconnect's mounting in a multichip module.

15 Claims, 7 Drawing Sheets

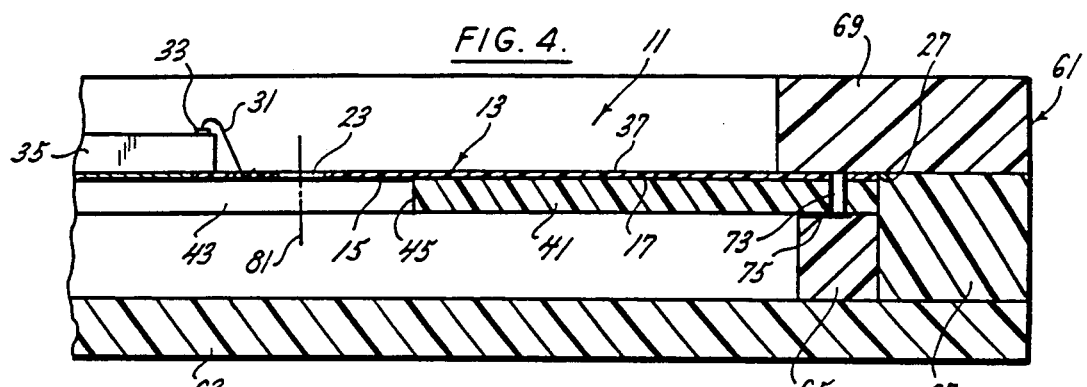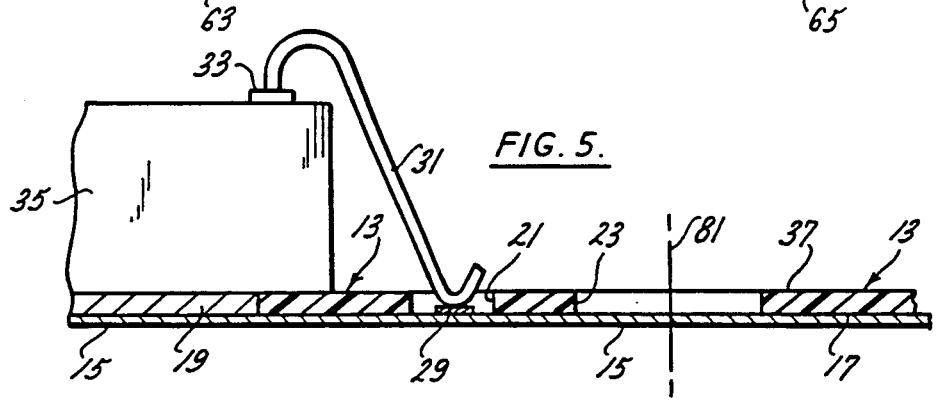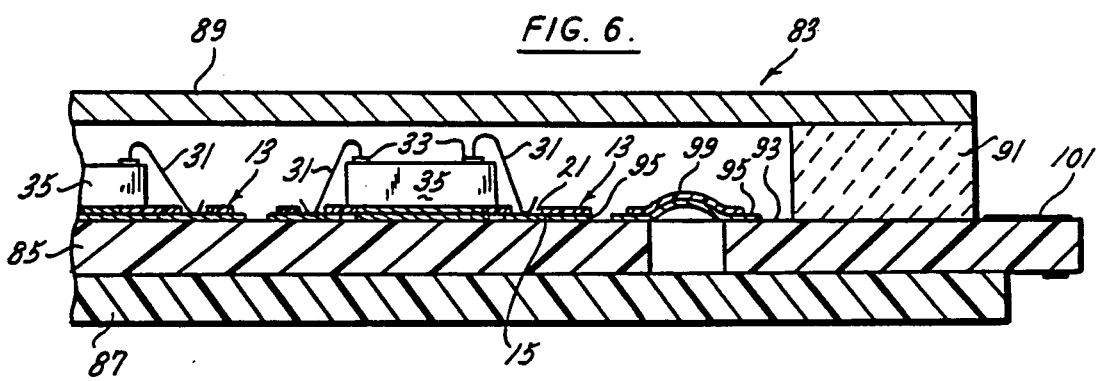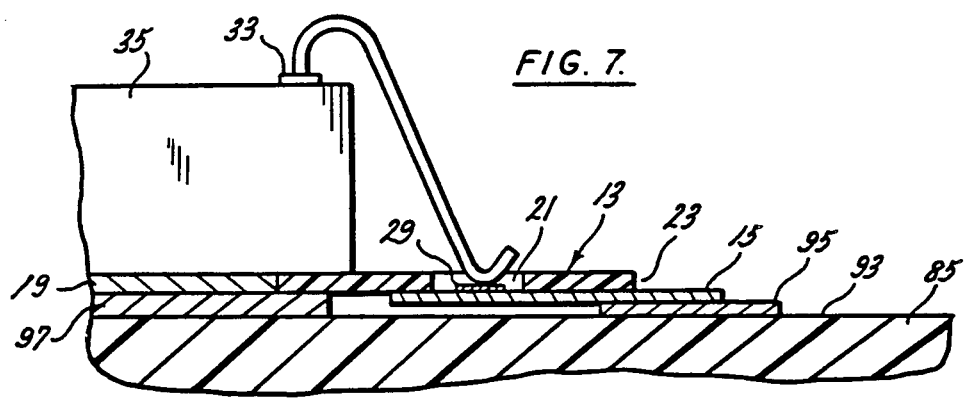

INTEGRATED CIRCUIT CHIP INTERCONNECT

FIELD OF THE INVENTION

The invention relates to the field of electronic integrated circuit chip carriers and more particularly to integrated circuit chip testing and mounting fixtures.

BACKGROUND OF THE INVENTION

Tape automated bonding (TAB) has been used to electrically communicate with multi-terminal integrated circuit (IC) chips for many years. Examples of the use of such a technique may be reviewed by viewing references such as U.S. Pat. No. 4,209,355 covering the manufacture of bumped composite tape for automatic gang bonding of semiconductor devices which shows the use of an insulated strip on which a plurality of metal fingers are bonded, the fingers terminating in a configuration where each finger mates with an IC bonding pad.

A variety of lead configurations have been proposed for such TAB implementations. For example, in U.S. Pat. No. 4,390,598 there is shown a particular lead format for TAB formats in which individual leads have stretch loops to accommodate elongation of the loop as the lead is bonded to a substrate after inner lead bonds have been formed to an IC chip. Such a lead frame allows temporary connection and testing of the circuit prior to final lead formation and packaging.

An IC assembly which features TAB techniques and an etched double metal clad plastic carrier to allow the chip to be mounted directly to one side of a metallic base while a metallic lead frame is disposed on the opposite side may be seen in U.S. Pat. No. 4,459,607.

U.S. Pat. No. 4,564,582 shows a carrier tape used for automatically bonding IC devices on a substrate and having sets of finger leads and sprocket holes, the carrier tape being made from a metallic foil tape such as copper coated with a photo resist material which is exposed using a photo mask including patterns for sprocket holes and finger lead clusters.

Another example of the prior art is shown in U.S. Pat. No. 4,571,354 which discloses a method and apparatus for tape automated bonding of ICs wherein a support ring is formed in the feature window to provide a reinforcement for unsupported interconnection leads between the inner and outer lead bond sites.

A low cost process for bonding a plurality of integrated circuit die to a variety of die support frames using TAB process is described in U.S. Pat. No. 4,661,192, and a universal test circuit for integrated circuit packages that can be interconnected via both wire bonding and mass bonding and which functions as a test vehicle for TAB process may be seen in U.S. Pat. No. 4,684,884.

Still other examples of prior art designs in the subject area are U.S. Pat. Nos. 4,706,811 and 4,747,017 for their showing of surface mount packages formed by nesting an encapsulated TAB IC module in between two plastic rings snapped together.

All of these prior art references are concerned with unique problems dealing with high density IC packaging and testing. As the speed of electronic systems increases, so too does the need to minimize the chip-to-chip spacing. Multichip modules address this issue by packing many integrated circuits in a common package which allows them to be placed very closely together. While this approach enables a system to operate at very high frequencies, it also makes it more difficult to test the individual chips. This is a critical issue since as the number of chips per package increases, the yield of the multichip module becomes increasingly dependent upon the yield of the individual chips.

Tape automated bonding provides the best method of accommodating both of these requirements. TAB consists of a polyamide tape with a layer of copper bonded to one side. The copper is printed and etched to create a lead frame. The invention utilizes the technique of providing lead spacing around the inside of the frame that matches the pad pattern of the chip and the lead spacing around the outside of the frame is fanned out to facilitate testing. After testing, the chip and leads are cut out of the TAB tape and the chip is installed in the module. TAB enables chips to be packaged very closely together and also enables each chip to be fully tested "At Speed" prior to installation.

However, there are some drawbacks to implementing TAB interconnects. Separate dedicated TAB bonding equipment may be required since conventional wire bonders are often incompatible with the TAB process. The process also requires the pads on the chip to be "Bumped" (plated with approximately 5 mils of gold) in order to bond the tape to the chip, and each chip will require a separate TAB tape design since the TAB leads must be etched to match the chip pad pattern. The cost of purchasing TAB bonding equipment, developing TAB tape designs, and adding the additional process to bump chips prevents many manufacturers from implementing TAB.

It should be clear that a flexible chip interconnect, combining the benefits of both TAB and conventional wire bonding processes, would be a valuable advancement in the art. Like TAB, it would provide a means to fully test each chip prior to installation. However, it wouldn't require new equipment or the need to bump chips since it relies on conventional wire bonding techniques. This would allow manufacturers experienced in wire bonding to implement a fully testable interconn.. :t system without expending large sums of money for n. w equipment. Another advantage is that it can provide a generic or non-custom interconnect for chips with a common die size, unlike TAB which must be etched to match the pad pattern of a specific chip. Thus, the system would allow several chips to use the same interconnect design.

SUMMARY OF THE PRESENT INVENTION

In accordance with the present invention, there is provided an integrated circuit chip interconnect adapted to support a rectangular integrated circuit chip having a plurality of conductive terminal pads disposed along each side thereof, and adapted to communicate via wire bonding with selected ones of the terminal pads. The invention includes a support member having an aperture therethrough, and a dielectric substrate mounted on and supported by the support member and having an integrated circuit chip accommodating location centrally disposed with respect to the support member aperture. Also included is a conductive lead pattern having relatively closely spaced inner contacts, relatively closely spaced intermediate contacts, and relatively widely spaced outer contacts. The lead pattern is disposed on the substrate and extends from the inner contacts adjacent each side of the chip accommodating location in relatively closely spaced parallel relation for a predetermined distance before fanning outwardly toward and terminating at the outer contacts at the outer edge of the substrate. The closely spaced parallel lead pattern portion includes the intermediate contacts on each of the leads inboard of the edge of the support member aperture.

It is an object of the present invention to provide a new and improved integrated circuit chip interconnect.

It is another object of the present invention to provide a simple yet effective integrated circuit chip interconnect technique that does not include the disadvantages of the prior art.

It is still another object of the present invention to provide an advantageous integrated circuit chip interconnect that will not require new equipment or the need to bump chips since it utilizes conventional wire bonding techniques.

It is yet another object of the present invention to provide a generic or non-custom integrated circuit chip interconnect for a common die size.

BRIEF DESCRIPTION OF THE DRAWINGS

FIG. 4 is an enlarged, partial, cross sectional view of the interconnect of FIG. 1 in its chip test configuration;

FIG. 5 is an enlarged portion of the cross sectional view of FIG. 4;

FIG. 6 is an enlarged, partial, cross sectional view of the interconnect of FIG. 1 showing the interconnect mounted in a multichip module;

FIG. 7 is an enlargement of a sectional view of a portion of the structure shown in FIG. 6;

DETAILED DESCRIPTION OF THE PREFERRED EMBODIMENTS

Figure 1:
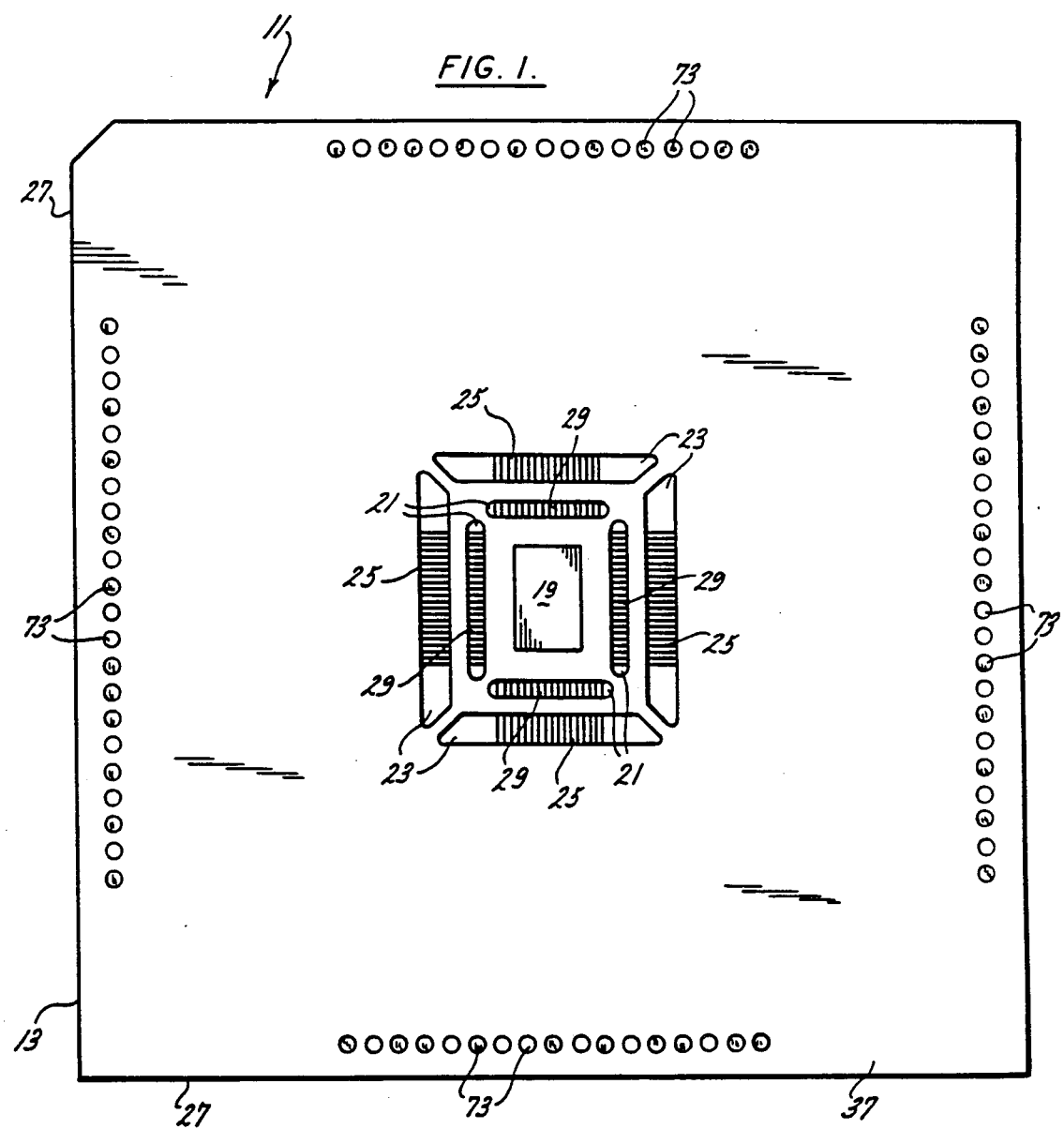
FIG. 1 is a top plan view of an integrated circuit chip interconnect constructed in accordance with an embodiment of the present invention.
Figure 2:
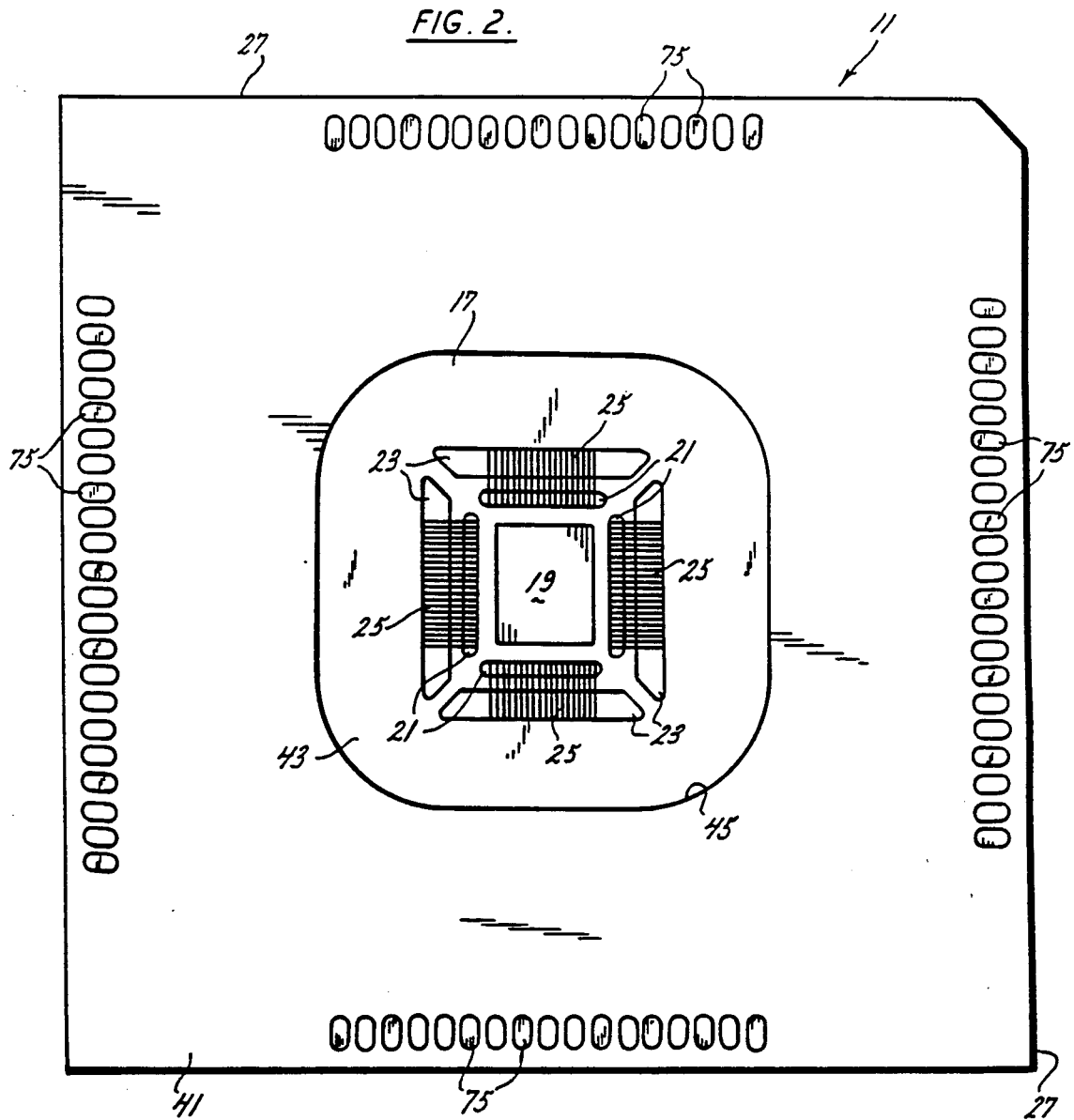
FIG. 2 is a bottom plan view of the interconnect shown in FIG. 1.

Referring now to the drawings and more particularly to FIGS. 1-5, there is shown an integrated circuit chip interconnect 11 constructed in accordance with an embodiment of the present invention. The interconnect 11 includes a dielectric substrate in the form of a polyamide flexible tape 13 having a layer 15 of copper bonded to its lower side 17. As part of the conductive layer 15, the tape 13 is provided with a chip or die attachment pad 19. Also, the tape 13 has four elongated wire bond pad apertures 21, and four intermediate elongated pad apertures 23.

Figure 3:
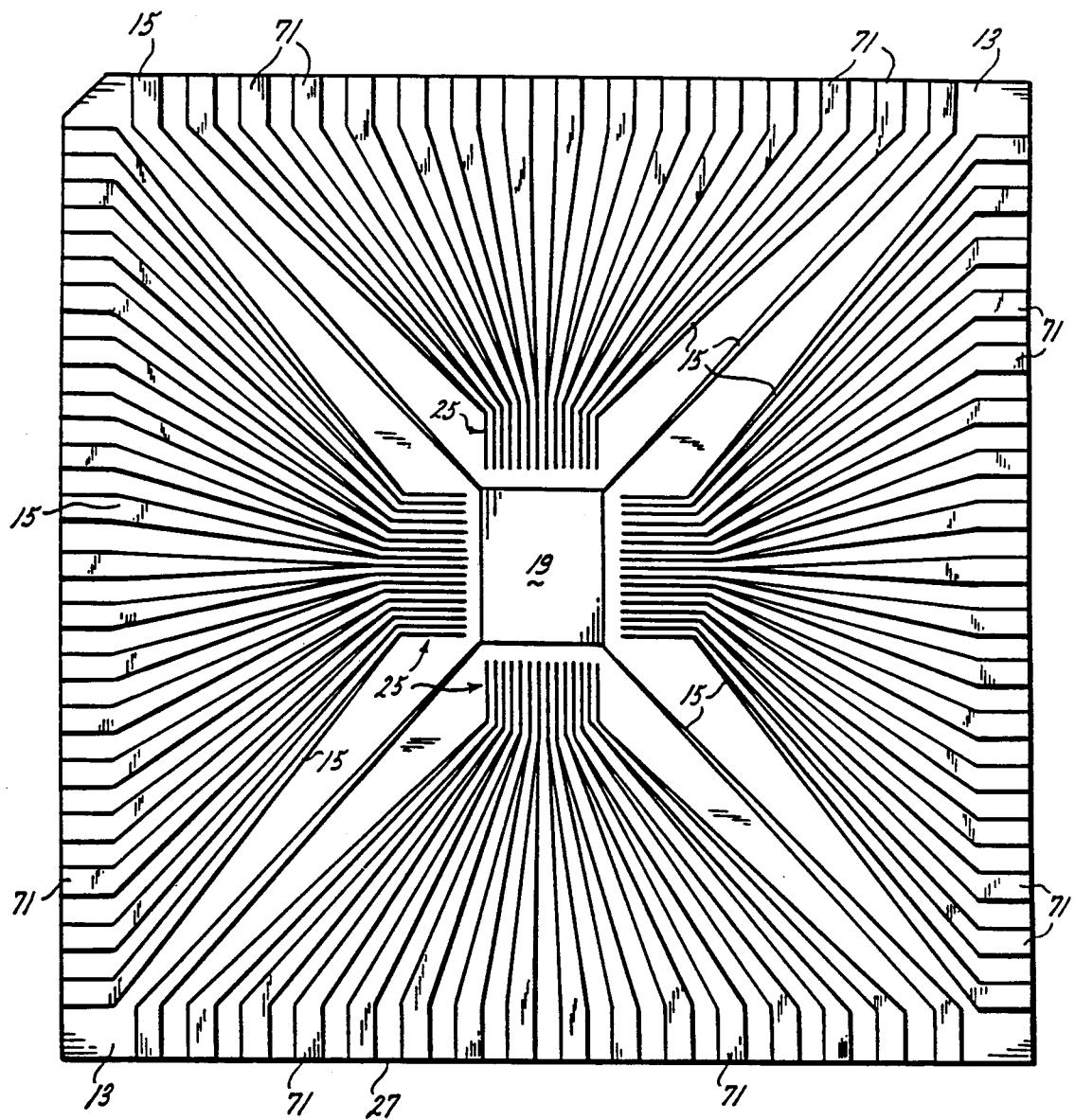
FIG. 3 is a plan view of the conductive lead pattern disposed on the bottom surface of the flexible tape used in the embodiment of FIG. 1.

The conductive layer 15 is etched or otherwise conventionally provided with a lead pattern 25, as shown in FIG. 3. Most of this pattern is not shown in FIGS. 1 and 2 in order not to obscure other details of this embodiment of the invention.

It will be noted from FIG. 3 that the pattern 25 is relatively closely spaced (6-mil spacing) toward the central pad 19 and which fans out to a relatively widely spaced (25-mil spacing) test pad lead pattern toward the outer peripheral edges 27 of the substrate 13.

The closely spaced lead pattern 25, toward the center of the conductive layer 15, provides 6-mil pitch wire bond pads 29 conductively accessible through the bond pad aperture 21. Thus, conventional wire bonds 31 can be conveniently attached to individual ones of the pads 29 and to associate ones of terminals 33 of an integrated circuit (IC) 35 disposed on the die attachment pad 19 on the upper side 37 of the tape 13, as best seen in FIGS. 4 and 5.

The 6-mil spaced lead pattern 25 of the conductive layer 15 is also accessible, for later conductive attachment, through the intermediate apertures 23 in the tape 13.

Generally symmetrically disposed relative to the location of the IC chip 35 on the pad 19 is a relatively inflexible stiffener ring structure 41 which is conventionally bonded to and supports the flexible substrate 13. In this embodiment, the stiffener ring 41 has a generally square outline and includes a square-shaped aperture 43, the edge 45 of which is located adjacent the intermediate pad apertures 23 downstream or on the side of these apertures toward the outer edge 27. In this embodiment where the conductive layer 15 is disposed on the lower side 17 of the substrate 13, the stiffener ring 41 is of a non-conductive material. However, a conductive ring 41 may be utilized if conventional precautions are taken to prevent shorting of the traces formed in or on the layer 15.

In accordance with this configuration, the interconnect 11 with an IC chip 35 mounted by any appropriate means on the attachment pad 19 and provided with wire bonds 31, may be introduced to a test fixture 61, as shown in FIG. 4. The test fixture includes a base test board 63, outer edge spacers 65, and outer and upper test socket structures 67, 69. Electrical contact with 25-mil pitch test pads 71 located at the outer edges 27 of the layer 15 are made by appropriately disposed conductive vias 73 through the insulative stiffener ring material. Of course, if the stiffener ring is conductive, the vias must be insulated. As seen in FIG. 4, the bottom of the vias 73 make electrical contact with associated contacts 75 in the spacers 65 of the test fixture 61. The contacts 75 are at the inner ends of conductive traces that extend externally of the fixture for test purposes, but are not shown.

After successful testing of the IC chip 35 in the test fixture 61, the chip, along with the tape 13 and the stiffener ring 41, is removed from the test structure and the tape 15 is cut or stamped (generally in the shape of a squared circle) such as along an excise line 81 that extends about the chip 35 generally coaxially with respect to the elongate axes of the four intermediate pad apertures 23. The central, excised portion of the interconnect 11 may then be placed in a multichip module 83, as shown in FIGS. 6 and 7.

The multichip module 83 includes an insulative interconnect-supporting base 85 disposed on a module base plate 87, and a metal or ceramic cover plate 89 supported above the base 85 by a ceramic spacer ring 91, for example. The upper surface 93 of the base 85 includes a conductive layer 95 having an appropriate lead pattern and upon which associated ones of the 6-mil pitch traces of the layer 15 rest and make electrical contact.

As can also be seen in FIG. 7, the chip 35 is in contact with pad 19, which is, in turn, in contact with a relatively large-area pad 97 disposed on the upper surface 93 of base 85. As is the practice in the art, thermal conductive paths (not shown) may be provided to the pad 97 to help conduct heat away from chip 35. Electrical connections from the interconnect-supporting base 85 to the outside world are provided by conventional TAB structures 99 which lead to external contacts 101.

In accordance with another embodiment of the present invention shown in FIGS. 8-11, an integrated circuit chip interconnect 111 includes a flexible tape 115 of dielectric material that has a copper or other conductive layer 117 disposed on its lower surface 119. The conductive layer 117 has a lead pattern etched or otherwise provided therein that has 6-mil pitch pads 121 at their inner ends and 25-mil pitch pads or contacts 123 at their outer ends, see FIG. 11.

In this embodiment, a conductive stiffener disk 125 is mounted on and attached to an upper surface 127 of the tape 115. Here, the dielectric tape provides the necessary electrical insulation required to prevent shorting of the conductive traces of the lead pattern disposed on the lower surface 119 of the tape 115.

Figure 8:
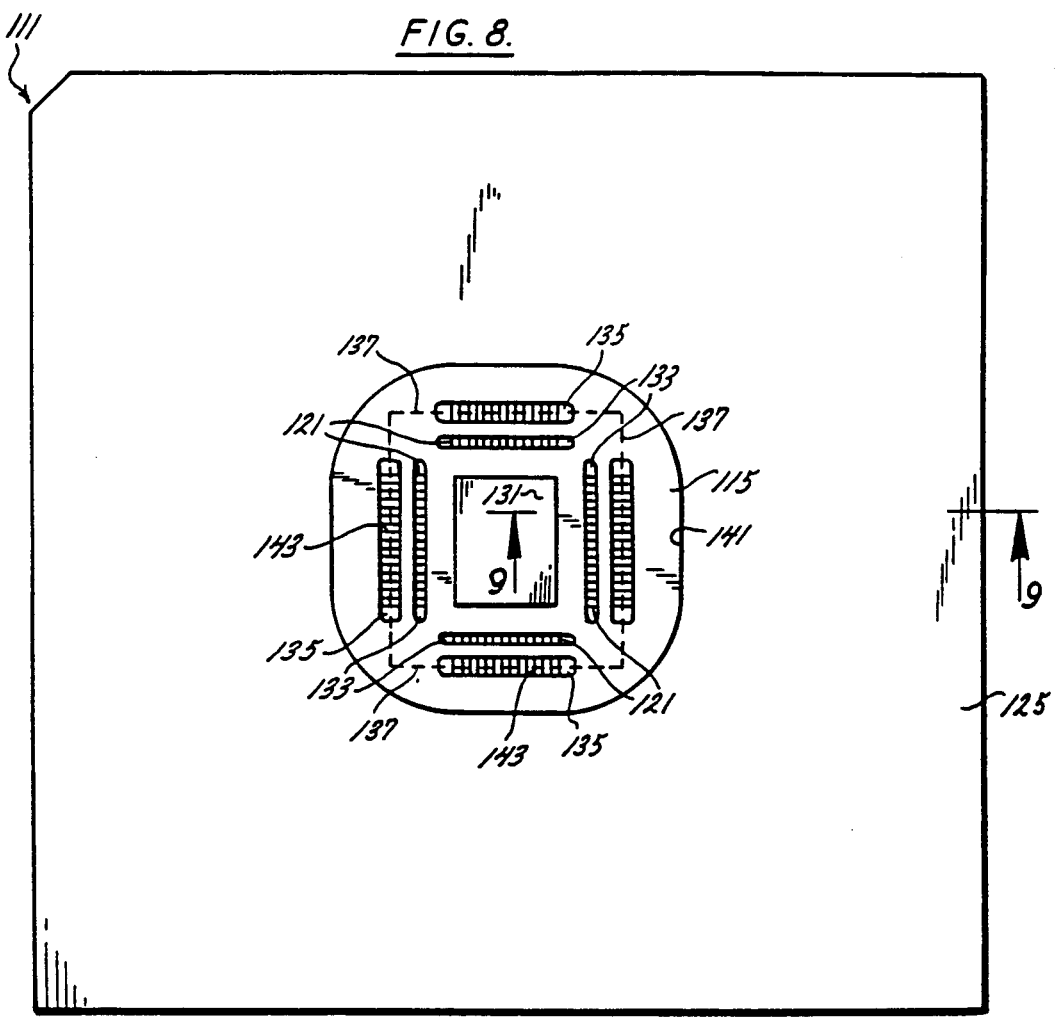
FIG. 8 is a top plan view of an integrated circuit chip interconnect constructed in accordance with a presently preferred embodiment of the invention.
Figure 9:
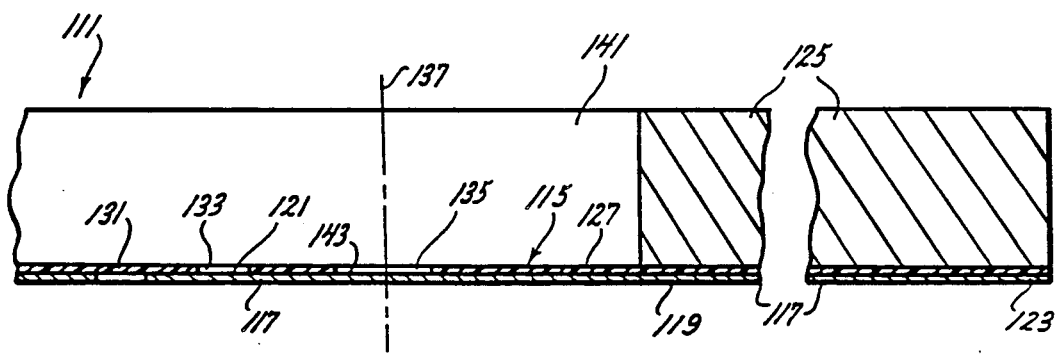
FIG. 9 is an enlarged elevational view taken along section lines 9—9 of the embodiment of the invention illustrated in FIG. 8.
Figure 10:
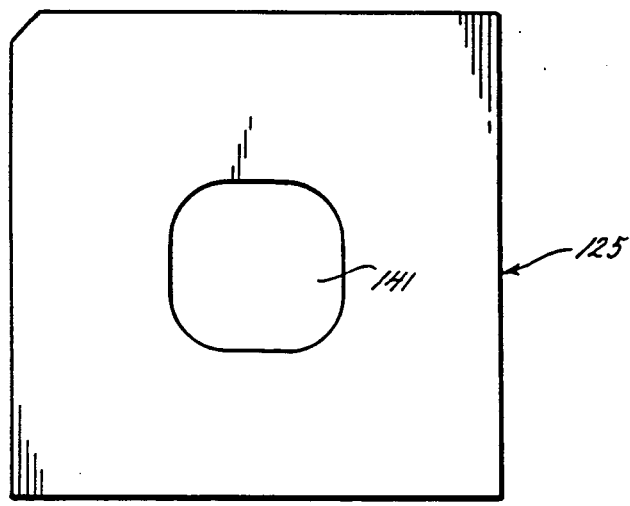
FIG. 10 is a top plan view of the stiffener member incorporated in the interconnect of FIG. 8.
Figure 11:
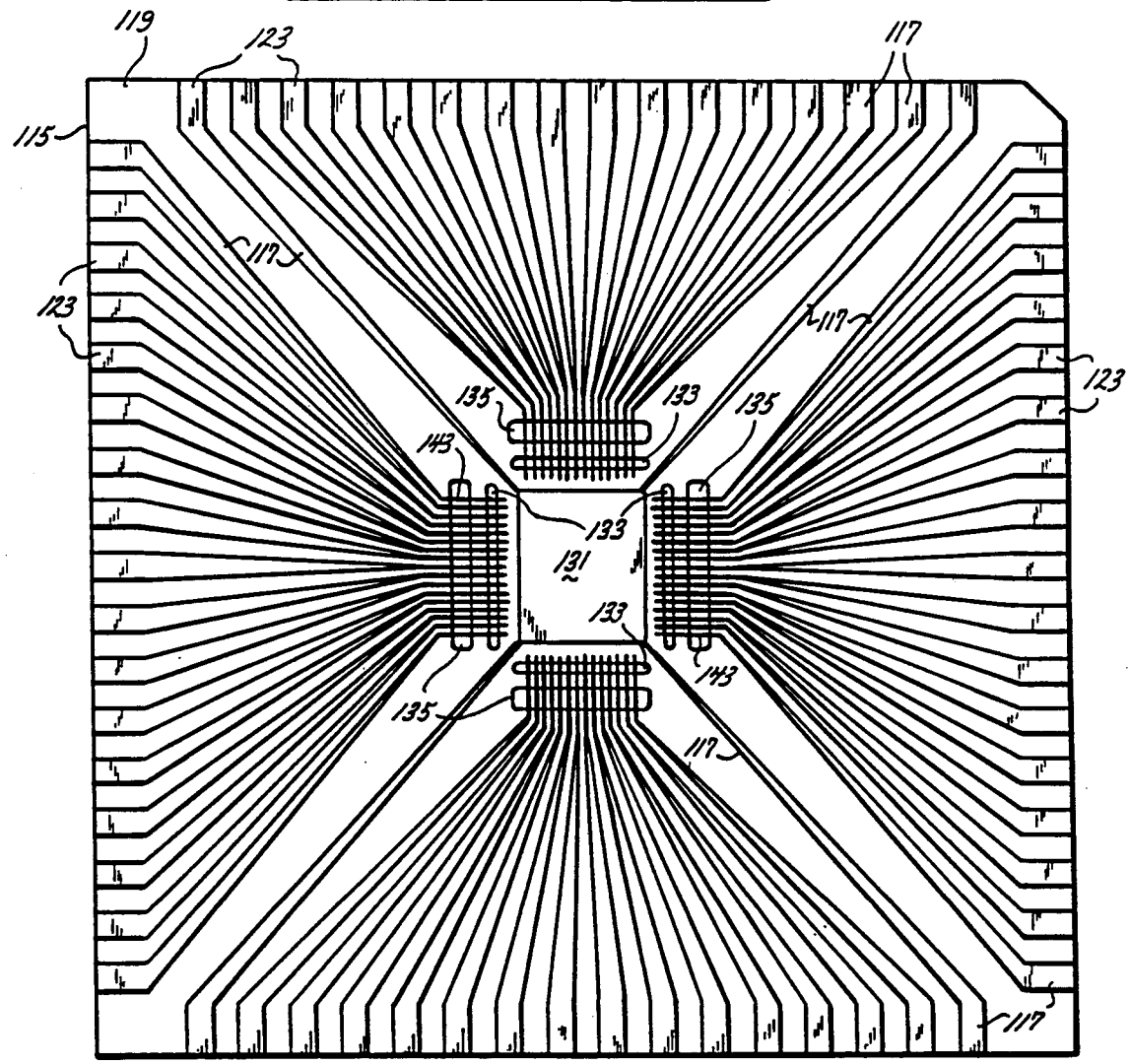
FIG. 11 is a bottom plan view of the dielectric layer used in the embodiment of the invention illustrated in FIG. 8 showing the fannedout lead pattern.
Figure 12:
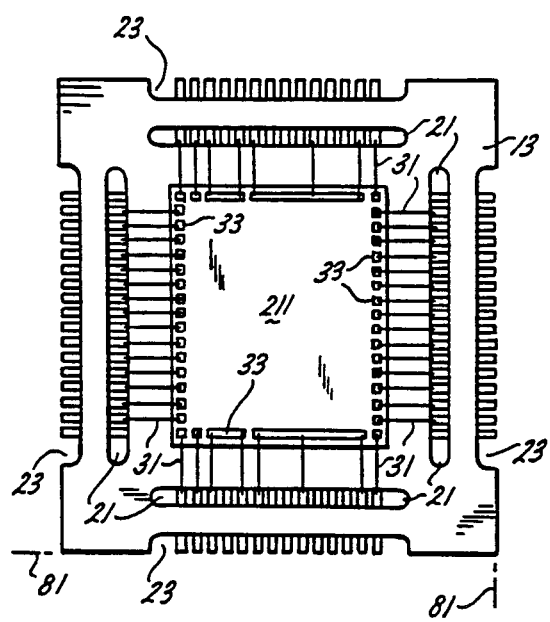
FIGS. 12-15 show how a variety of different chips can be accommodated by the present invention.
Figure 13:
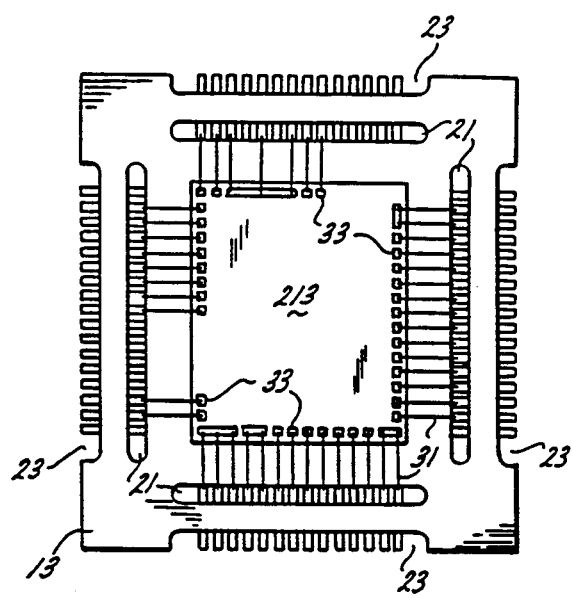
Figure 14:
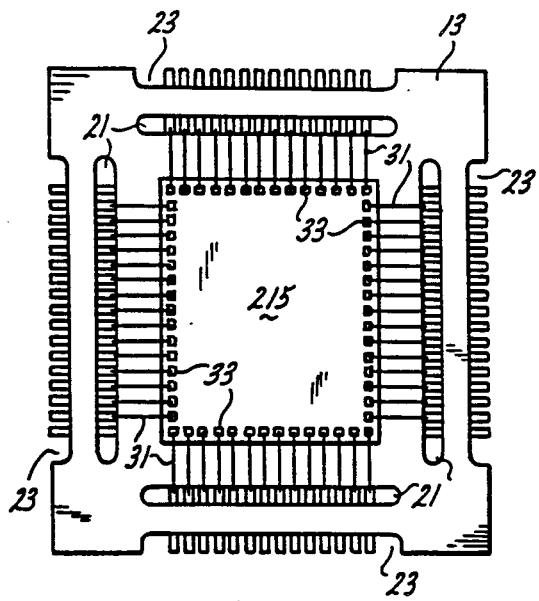
Figure 15:
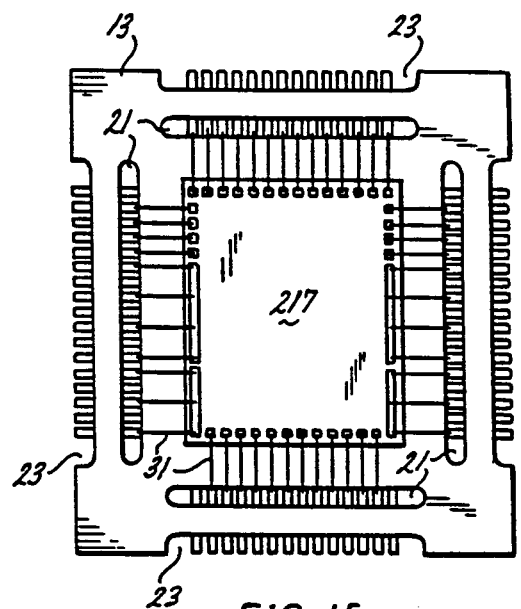

FIG. 8 clearly indicates the central position of a die attach pad 131, four elongated 6-mil wire bond access apertures 133, and four elongated intermediate positioned 6-mil pitch lead access apertures 135 downstream of the wire bond access apertures 133. Also clearly indicated are dashed excise pattern lines 137 extending along the axes of the elongated intermediate apertures 135. It should be noted that the excise pattern lines 137 are within a central aperture 141 in the stiffener disk 125. Thus, when an IC chip disposed on the die attach pad 131 has been tested and is to be installed, the chip and its 6-mil lead pattern on the tape 115 may be separated from the stiffener ring 125 by using an appropriate punch or cutter, for example (not shown), that cuts the tape along the excise line identified by reference numeral 137. This action will leave 6-mil pitch contacts 143 exposed in the remaining half of the intermediate aperture 135 for contact with external circuitry by any conventional means.

It should be clear from the foregoing that there has herein been described a new and useful integrated circuit chip interconnect that overcomes the disadvantages of the prior art, that does not require special attachment techniques since it utilizes conventional wire bonding, and that provides a generic IC chip interconnect for a common die size. For example, unlike tape automated bonding (TAB) technology, the lead pattern of the interconnect in accordance with the present invention does not have to match the lead pattern of a specific chip. In accordance with the invention, by designing an interconnect with the maximum number of leads for a given die size, a variety of different chips 211, 213, 215, and 217 can be accommodated by the same interconnect, as illustrated in FIGS. 12-15, respectively.

Although the inventive concept has been shown to test and install individual chips, it could as well equally apply to the test and installation of multichip modules or other assemblies which are difficult to test due to fine lead spacing.

It should further be understood that although the various embodiments of the present invention have been described with specific embodiments and components, other elements and components exhibiting similar functions and properties may be utilized in accordance with the teachings of the invention.

What is claimed is:

1. An integrated circuit chip interconnect adapted to support a rectangular integrated circuit chip having a plurality of conductive terminal pads disposed along each side thereof, and adapted to communicate via wire bonding with selected ones of the terminal pads, comprising:

a relatively inflexible support member having an aperture therethrough;

a relatively flexible dielectric substrate mounted on and supported by said support member and having an integrated circuit chip accommodating location centrally disposed with respect to said aperture; and a conductive lead pattern having relatively closely spaced inner contacts, relatively closely spaced intermediate contacts, and relatively widely spaced outer contacts, said lead pattern being disposed on said substrate and extending from said inner contacts adjacent each side of said chip accommodating location in relatively closely spaced parallel relation for a predetermined distance before fanning outwardly toward and terminating at said outer contacts at the outer edge of said substrate, said closely spaced parallel lead pattern portion including said intermediate contact son each of the leads inboard of the edge of said support member aperture.

2. The integrated circuit chip interconnect according to claim 1, wherein said aperture in said support member is generally of rectangular shape.

3. The integrated circuit chip interconnect according to claim 1, wherein said support member is of elctrically insulative material.

4. The integrated circuit chip interconnect according to claim 1, wherein said support member is of electrically conductive material.

5. The integrated circuit chip interconnect according to claim 1, wherein said inner contacts have about a 6-mil pitch.

6. The integrated circuit chip interconnect according to claim 1, wherein said outer contacts have about a 25-mil pitch.

7. The integrated circuit chip interconnect according to claim 1, also comprising an excise line disposed about said integrated circuit chip accommodating location orthogonally through adjacent ones of said intermediate contacts and adapted to be severed therealong deleting said fanned out portion and said outer contacts of said conductive lead pattern.

8. The integrated circuit chip interconnect according to claim 1, wherein said dielectric substrate includes at least one elongated intermediate pad aperture exposing said intermediate contacts.

9. The integrated circuit chip interconnect according to claim 1, wherein said integrated circuit chip accommadating location includes a conductive chip attachment pad.

10. The integrated circuit chip interconnect according to claim 1, wherein said dielectric substance is disposed above said support member.

11. The integrated circuit chip interconnect according to claim 1, wherein said dielectric substrate is disposed below said support member.

12. The integrated circuit chip interconnect according to claim 11, wherein said support member is of an electrically non-conductive material.

13. The integrated circuit chip interconnect according to claim 12, wherein said support member is of an electrically conductive material.

14. An integrated circuit chip interconnect adapted to receive an integrated circuit chip having a plurality of conductive terminal pads disposed about its periphery and to communicate with selected ones of theses terminal pads, comprising:
- a relatively inflexible support member having a centrally located aperture therethrough;
- a flexible dielectric substrate having an integrated circuit chip accommodating pad centrally disposed thereon, said substrate being substantially symmetrically mounted on and supported by said support member;
- a conductive lead pattern disposed on said substrate extending in spaced relation form the edges of said chip accommodating pad outward to the outer edges of said substrate, said lead pattern having a relatively fine wire bonding pad pattern adjacent said chip accommodating pad accessible by wire bonding to terminal pads of an integrated circuit chip disposed on said chip accommodating pad, said lead pattern also having a relatively fine intermediate contact pattern adjacent said wire bonding pad pattern, said lead pattern fanning out downstream of said intermediate contact pattern to a relatively wider spaced outer pad pattern adjacent the outer peripheral edges of said substrate, the edges of said aperture through said support member being located adjacent to and downstream of said intermediate contact pattern.

15. An integrated circuit chip interconnect adapted to support a rectangular integrated circuit chip having a plurality of conductive terminal pads disposed along each side thereof, and adapted to communicate via wire bonding with selected ones of the terminal pads, comprising:
- a support member having an aperture therethrough;
- a dielectric substrate mounted on and supported by said support member and having an integrated circuit chip accommodating location centrally disposed with respect to said aperture;
- a conductive lead pattern having relatively closely spaced inner contacts, relatively closely spaced intermediate contacts, and relatively widely spaced outer contacts, said lead pattern being disposed on said substrate and extending from said inner contacts adjacent each side of said chip accommodating location in relatively closely spaced parallel relatively closely spaced parallel relation for a predetermined distance before fanning outwardly toward and terminating at said outer contacts at the outer edge of said substrate, said closely spaced parallel lead pattern portion including said intermediate contacts on each of the leads inboard of the edge of said support member aperture; and
- an excise line disposed about said integrated circuit chip accommodating location orthogonally through adjacent ones of said intermediate contacts and adapted to be severed therealong, deleting said fanned out portion and said outer contacts of said conductive lead pattern.

* * * * *